United States Patent
Soleimani et al.

(10) Patent No.: US 6,370,204 B1
(45) Date of Patent: Apr. 9, 2002

(54) METHOD AND APPARATUS FOR PERFORMING DIGITAL FRACTIONAL MINIMUM SHIFT KEY MODULATION FOR A VERY SMALL APERTURE TERMINAL

(75) Inventors: Mohammad Soleimani, Rockville; John E. Corrigan, III, Chevy Chase, both of MD (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/511,673

(22) Filed: Feb. 23, 2000

Related U.S. Application Data

(62) Division of application No. 08/523,308, filed on Sep. 5, 1995, now Pat. No. 6,097,765.

(51) Int. Cl.[7] .............................. H03C 3/00; H03K 7/06; H04L 27/12
(52) U.S. Cl. ...................... 375/305; 375/274; 455/3.02; 455/12.1; 455/118; 455/427
(58) Field of Search .................. 455/3.1, 12.1, 455/53.1, 42, 118, 112, 3.2, 437, 430, 3.02, 427; 375/269, 294, 272, 274, 297, 303, 306, 308, 334, 336, 371, 305; 370/316, 319, 532, 204; 332/100–102

(56) References Cited

U.S. PATENT DOCUMENTS

| | | | |
|---|---|---|---|
| 3,866,122 A | 2/1975 | Baer et al. | 325/45 |
| 3,993,868 A | 11/1976 | Balcewicz | 375/274 |
| 4,605,968 A | 8/1986 | Hayashi | 358/188 |
| 4,755,773 A | 7/1988 | Ohmagari | 375/9 R |
| 5,062,122 A | 10/1991 | Pham et al. | 375/1 |
| 5,230,010 A | 7/1993 | Betts et al. | 375/39 |
| 5,301,367 A | 4/1994 | Heinonen | 455/76 |
| 5,309,479 A | 5/1994 | Cheah | 375/62 |
| 5,325,401 A | 6/1994 | Halik et al. | 375/83 |
| 5,376,941 A | 12/1994 | Fukazawa et al. | 342/359 |
| 5,408,687 A | 4/1995 | Ooga | 455/76 |
| 5,410,747 A | 4/1995 | Ohmagari et al. | 455/118 |
| 5,488,379 A | 1/1996 | Jackson et al. | 342/359 |
| 5,559,809 A | 9/1996 | Jeon et al. | 370/120 |
| 5,561,433 A | 10/1996 | Chaney et al. | 342/359 |
| 5,576,666 A | 11/1996 | Rauvola | 331/25 |
| 5,577,074 A | 11/1996 | Roos et al. | 375/327 |
| 5,578,972 A | 11/1996 | Hadden et al. | 333/135 |
| 5,594,735 A | 1/1997 | Jokura | 370/337 |
| 5,671,220 A | 9/1997 | Tonomura | 370/281 |
| 5,678,210 A | 10/1997 | Hannah | 455/128 |
| 5,706,310 A * | 1/1998 | Wang et al. | 375/296 |
| 5,774,788 A | 6/1998 | Hannah et al. | 455/12.1 |
| 5,790,601 A | 8/1998 | Corrigan, III et al. | 375/302 |
| 6,122,326 A * | 9/2000 | Jackson et al. | 375/300 |

OTHER PUBLICATIONS

Morihiro et al, A 100Mbs Prototype 175 K Modem for Satellite Communications, IEEE Transactions on Communications, vol. COM—27, No. 10; pp. 1512–1517, Oct. 1979.*

* cited by examiner

*Primary Examiner*—Jean Corrielus
(74) *Attorney, Agent, or Firm*—John T. Whelan; Michael W. Sales

(57) ABSTRACT

A method and apparatus for performing fractional minimum shift key modulation for a very small aperture terminal. A signal with a fractional modulation which appears to be frequency shift key is generated in the indoor unit. The outdoor unit employs a novel multiplication method to translate this signal to a minimum shift key modulated signal for satellite transmission.

8 Claims, 2 Drawing Sheets

METHOD AND APPARATUS FOR PERFORMING DIGITAL FRACTIONAL MINIMUM SHIFT KEY MODULATION FOR A VERY SMALL APERTURE TERMINAL

This is a divisional of application Ser. No. 08/523,308 filed Sep. 5, 1995 now U.S. Pat. No. 6,097,765.

BACKGROUND OF THE INVENTION

Satellite communication systems typically employ large aperture antennas and high power transmitters for establishing an uplink to the satellite. Recently, however, very small aperture antenna ground terminals, referred to as remote ground terminals, have been developed for data transmission at low rates. In such systems, the remote ground terminals are utilized for communicating via a satellite from a remote location to a central hub station. The central hub station communicates with multiple remote ground terminals, and has a significantly larger antenna, as well as a significantly larger power output capability than any of the remote ground terminals.

Typically, the remote ground terminals comprise a small aperture directional antenna for receiving and transmitting signals to a satellite, an outdoor unit ("ODU") mounted proximate the antenna for generating a modulated carrier signal to be transmitted to the central hub station and for receiving signals from the central hub station, and an indoor unit ("IDU") which demodulates the received signals and which also operates as an interface between a specific user's communication equipment and the outdoor unit.

Because the viability of the remote ground terminal concept increases as the cost for providing the remote ground terminal at the remote location decreases, it is necessary to decrease the cost of the remote ground terminal as much as possible. Furthermore, in order to decrease the operational costs, it is also necessary to decrease the size, weight and overall complexity of the remote ground terminal. Remote terminals with antenna diameters smaller than approximately 2 meters are often referred to as very small aperture terminals, or VSATs.

VSAT technology has followed a steady progression of cost and size reduction since the concept was first introduced in the early 1980s. Some of the earliest VSATs used a transmitter design topology known as "direct modulation" in which the RF carrier is modulated directly within the ODU. This concept provided several advantages over the previous earth station design practice in which a modulated IF carrier is fed to the ODU from the IDU and upconverted. Some drawbacks exist with direct modulation however, in that the VSAT's synthesizer (typically comprised of two parts: a "wideband loop" and a "narrowband loop") must be located in the outdoor equipment which is subject to more environmental extremes (temperature, vibration, etc.) than the indoor equipment. Also, due to the large number of circuits in the ODU, AC power is typically required at the outdoor equipment. A further disadvantage of this approach is that the modulating data (the transmitter's input signal) and the synthesizer control signals must be conveyed to the ODU via some means. This was typically done with an expensive multi-pair cable running between the IDU and ODU (the intra-facility link, or IFL), although other multiplexing schemes have been used.

Later VSATs reduced the size and component count in the ODU by relocating the synthesizer to the IDU. In this design, the ODU used a phase-locked-loop (PLL) to develop an RF local oscillator (LO) signal. This LO signal was used to upconvert the IF signal fed from the IDU. The advantages of a smaller ODU package are readily apparent, but a wideband (typically 500 MHz) IFL cable between the IDU and the ODU is required. This cable is costly and limits the maximum distance between the IDU and ODU. Also, control and stabilization of the output power level is more complex than in the previous example.

A third type of known VSAT design falls somewhere between the previous two in concept. In this third approach, the synthesizer is split with the narrowband loop in the IDU and the wideband loop in the ODU. The modulation is performed in the IDU to minimize the amount of equipment located outdoors. The cost of the IFL cable can be reduced because it is not necessary to carry a wide bandwidth transmit signal to the ODU. A lower cost "narrowband" IFL cable can be used. There are several drawbacks to this approach. Because the wideband synthesizer is located in the ODU, it must withstand increased temperature and vibration. Also, the synthesizer control signals must be conveyed to the ODU. Furthermore, because the modulated IF signal from the IDU is conveyed as an analog waveform, it is subject to noise and other impairments, especially level variations, as it traverses the IFL cable.

Accordingly, there exists a need to improve upon the preciously discussed techniques to provide a VSAT in which: 1) no synthesizers are required in the ODU; 2) a narrowband IFL cable can be used; 3) sensitivities to the noise and level variation distortions on the IFL are eliminated; and 4) the overall complexities and cost of the VSAT are minimized.

SUMMARY OF THE INVENTION

The present invention provides a remote ground terminal designed to satisfy the aforementioned needs. Specifically, the invention includes an IDU which generates a fractionally modulated signal in a first frequency band having certain spectral purity, frequency resolution and stability characteristics, and an ODU which employs a straightforward multiplication method for translating the fractionally modulated signal to a minimum shift key (MSK) modulated signal in a second frequency band suitable for satellite transmission.

More particularly, the present invention comprises a ground terminal for transmitting satellite communications. In a preferred embodiment, the IDU utilizes microprocessor logic to control a DDS which serves as a carrier frequency source and a modulator. The fractional modulation riding on the DDS carrier signal appears as frequency shift key (FSK) modulation at $\frac{1}{128}$ of the final modulation which is ultimately transmitted to the satellite. The DDS signal is frequency translated to an intermediate frequency (IF) band and then fed through a cable multiplexor (MUX) to the ODU with nominal loss and disturbance.

In one embodiment of the present invention, the ODU includes a multiplying phase locked loop (PLL) and a frequency multiplier circuit for translating the signal received from the IDU to a MSK modulated signal suitable for satellite transmission. In another embodiment, however, the translation to a MSK modulated signal suitable for satellite transmission is performed employing only a multiplying PLL without the need for an additional multiplier. In either of these embodiments, the ODU acts as a frequency multiplier. The RF output of the ODU is a frequency which is an exact ratio of the IF signal frequency received from the IDU (in the presently preferred embodiments the ratio is x128). As noted earlier, the IF signal is frequency modulated with a deviation of 1/128 of the desired modulation before it is conveyed to the ODU. The RF output at the ODU is then in modulated as desired. Because the RF signal is generated locally in the ODU in a PLL, its output level can be easily maintained at a constant level. This feature eliminates the need for complex power control circuits and eliminates the adverse effects of signal level variation caused by losses in the IFL cable. Because the function of both of these two ODU designs is equivalent from a performance point of view, either embodiment attains the advantages of the invention described herein.

The MSK modulated signal is then amplified by a solid state power amplifier (SSPA) before being fed to an ortho mode transducer (OMT). The OMT launches the signal into a feed horn, which in turn sends the signal to the small aperture antenna for transmission to the satellite.

According to the modulation scheme of the present invention, the ODU is simplified in that (1) no synthesizer is required, only a straightforward PLL or frequency multiplier is used; (2) power level control of the ODU's output can be reduced or eliminated because cable impairments do not affect the signal; and (3) control circuits in the ODU are reduced because the modulating data is impressed upon the IF signal directly and no separate multiplexing or other signal conveyance means is required.

Further simplification is achieved in the IDU by combining the frequency reference and the modulator into one DDS circuit.

The invention itself, together with further objects and attendant advantages, will be understood by reference to the following detailed description, taken in conjunction with the accompanying drawings.

DETAILED DESCRIPTION OF THE DRAWINGS

Figure 1:
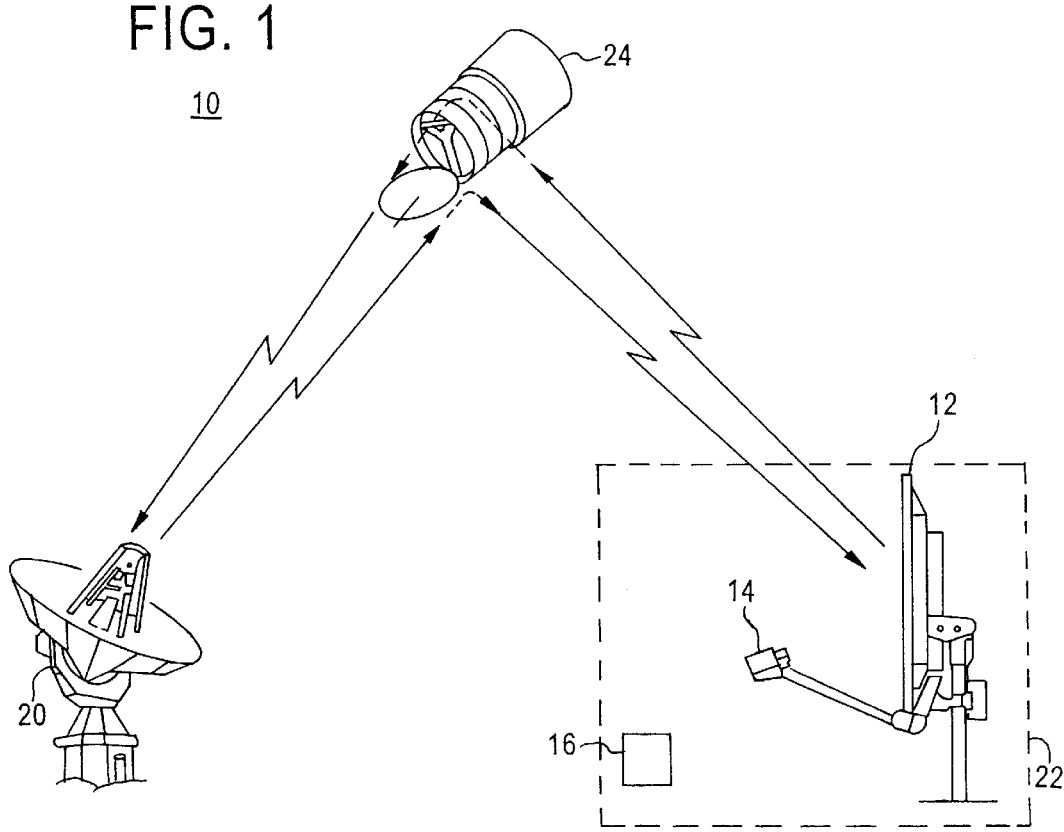
FIG. 1 is a block diagram of a very small aperture terminal ("VSAT") satellite communication network which utilizes the present invention.

The VSAT satellite communication network 10 illustrated in FIG. 1, includes a central hub station 20, a communication satellite 24, and a plurality of remote ground terminals 22 (only one is shown). The VSAT network 10 functions as a two way transmission system for transferring data and voice communications between the central hub station 20 and the numerous remote ground terminals 22. All data is transferred between the central hub station 20 and the remote ground terminals 22 via transponders located in the satellite 24. Signals transmitted from the central hub station 20 to the remote ground terminal 22 are referred to as "outroute", while signals transmitted in the opposite direction are referred to as "inroute".

As shown in FIG. 1, the communication satellite 24 functions as a microwave relay. It receives signals from both the central hub station 20 and the remote ground terminals 22 at a first frequency and then retransmits the signals at a second frequency. The satellite 24 includes transponders which receive, amplify and retransmit each signal within predefined bandwidths. The transponders of the VSAT network 10 shown in FIG. 1 can operate in various frequency bands, for example, Ku and C band.

The remote ground terminal 22 includes a small aperture antenna 12 for receiving (i.e., downlinking) and transmitting (i.e., uplinking) signals, an outdoor unit 14 typically mounted proximate the antenna 12 and an indoor unit 16 which operates as an interface between a specific user's communication equipment and the outdoor unit 14. A suitable antenna 12 is manufactured by Prodelin and has a 1 meter offset feed.

Figure 2:
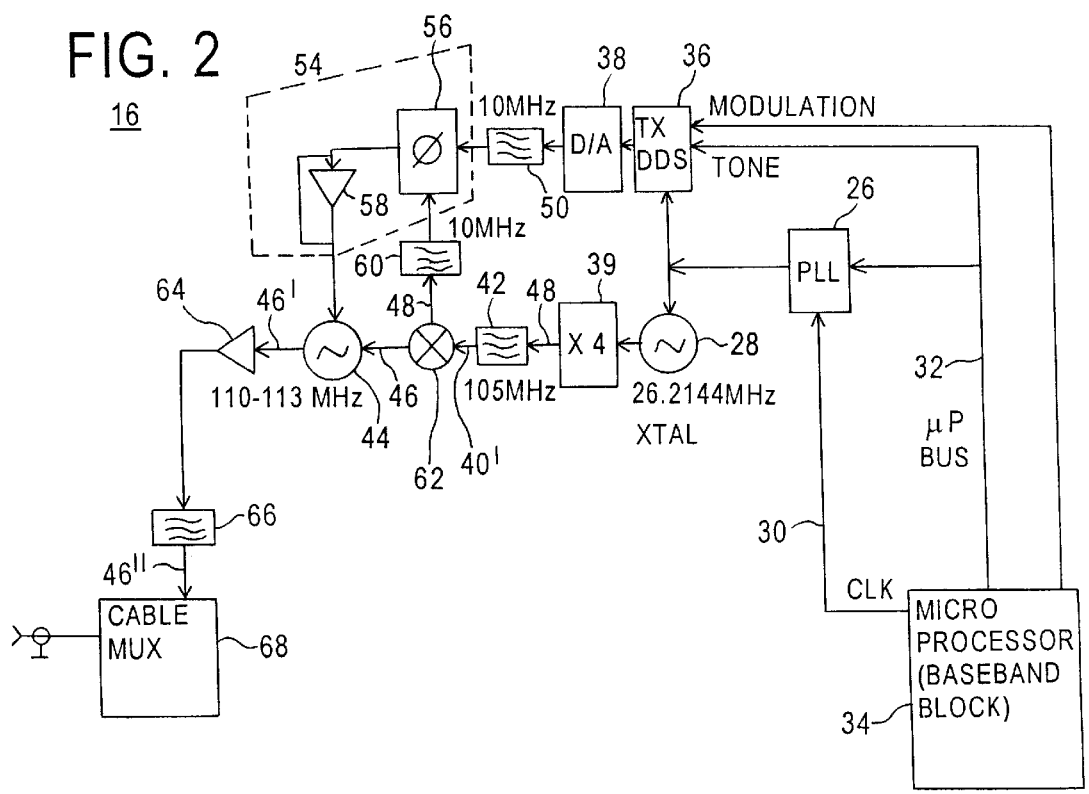
FIG. 2 is a schematic diagram of one embodiment of an indoor unit in accordance with the present invention.

FIG. 2 is a schematic diagram of one embodiment of the indoor unit 16 of the present invention. As shown in FIG. 2, the indoor unit 16 includes a frequency locked loop (FLL) 26 which functions to stabilize the frequency of the entire transmitter synthesizer chain including the signal generated by the transmit (TX) direct digital synthesizer (DDS) 36.

In the presently preferred embodiment, the FLL 26 is coupled to a 26 MHz crystal oscillator (CO) 28 and the clock output of a microprocessor 34. The FLL 20 compares the frequency of these two inputs and sends the deviation, if any, back to the microprocessor 34 over the microprocessor bus 32. The microprocessor 34, in turn, sends the deviation information to the TX DDS 36 so that it can compensate for the deviation in the frequency of the CO 28.

The microprocessor 34 also sends tune and modulation information to the TX DDS 36. The TX DDS 36 uses this information to perform frequency synthesis. In the presently preferred embodiment, the TX DDS 36 generates a first 5 to 8 MHz carrier signal and modulates the information received from the microprocessor 34 onto this carrier signal. The modulation of the carrier signal is created by the DDS to be equal to the desired MSK modulation with its frequency deviation reduced by a factor of 1/128. (The final desired MSK modulation will to result from operations in the ODU 14 shown in FIGS. 3 & 4.) The 5 to 8 MHz carrier signal is then converted to an analog signal by a digital to analog (D/A) converter 38 and passed through a filter 50 with a cutoff frequency of 10 MHz to remove unwanted harmonic frequencies.

The frequency resolution of the modulation is an important parameter. The modulator including the DDS, establishes the carrier center frequency in the channel assigned for transmission of the data, and also performs modulation of the data. The DDS is capable of producing frequency modulation on the carrier. The DDS performs modulation by moving its output frequency in small increments in accordance with the prescribed modulation method and signal shaping requirements of the system. If the DDS's resolution is fine enough, it can produce various types of modulation including frequency-shift-key (FSK), and minimum-shift-key (MSK) including Gaussian-minimum-shift-key (GMSK). In the presently preferred embodiments, MSK modulation is used at rates of 128 kb/s. The MSK modulated signal can be described by the following formula:

$$s(t)=\cos [2\pi(f_o+(dk/4T))t+Xk]kT<t<(k+1)T$$

where fo is the carrier center frequency, dk=±1 represents the data stream to be transmitted at the rate R=1/T and xk is an arbitrary phase constant. For the presently preferred embodiments, the peak deviation requirement is 32 kHz and the ODU multiplies the IF frequency by 128. Therefore, the peak deviation at the DDS output is 250 Hz (32 kHz÷128= 250 hz). Because the DDS resolution is on the order of 1 Hz, good modulation accuracy can be obtained.

The short-term stability or "phase noise" of the carrier is required to fall below certain levels. In the typical satellite transmission system referred to above, the phase noise must fall below 5° rms. Because the ODU will produce phase noise equal to the IDU's phase noise increased by the multiplication factor (in this case 128), the IDU's phase noise output must be held to below 0.039° rms. (5°÷128= 0.039° rms).

In the presently preferred embodiment, the frequency of the 26 MHz CO 28 is multiplied by 4 by a multiplier 39 to produce a 105 MHz signal 40 which is passed through a filter 42 with a 105 MHz cutoff frequency to remove side bands. A second crystal oscillator 44 is used to generate a 110 to 113 MHz signal 46. The filtered 105 MHz signal 40' is mixed with the 110 to 113 MHz CO signal 46 to provide a second 5 to 8 MHz analog signal 48. This second 5 to 8 MHz signal 48 is passed through a filter 60 with a cutoff frequency of 10 MHz to remove side bands.

The filtered 5 to 8 MHz analog signal from the D/A converter 38 is coupled to a phase locked loop (PLL) circuit 54 along with the filtered 5 to 8 MHz signal from the mixer 62. The PLL circuit 54 includes a phase detector 56 coupled to an amplifier 58 in a low feedback loop. The PLL circuit 54 functions to ensure that the 110–113 MHz signal created by the CO 44 is phase locked to the signal generated by the TX DDS 36.

After the second CO signal 46 is phase locked to the TX DDS signal 52, the second CO signal 46' is amplified by an amplifier 64, passed through a filter 66, and sent through a cable multiplexor (MUX) 68 for transmission to the outdoor unit 14.

Suitable components for the IDU shown in FIG. 2 are as follows: (1) microprocessor 34—Intel 8051; (2) FLL 26—Intel 8254 (with additional logic circuits); (3) CO 28—Murata, OCXO, 26.2144 MHz; (4) multiplier 39—Siliconix J310; (5) phase detector 56—National Semiconductor 74AC74, 74AC00; (6) amplifiers 58, 64—Minicircuit MAR08; and (7) mixer 62—Synergy SMD-C2. The remainder of the components shown in FIG. 2 are commonly known to those skilled in the art.

Figure 3:
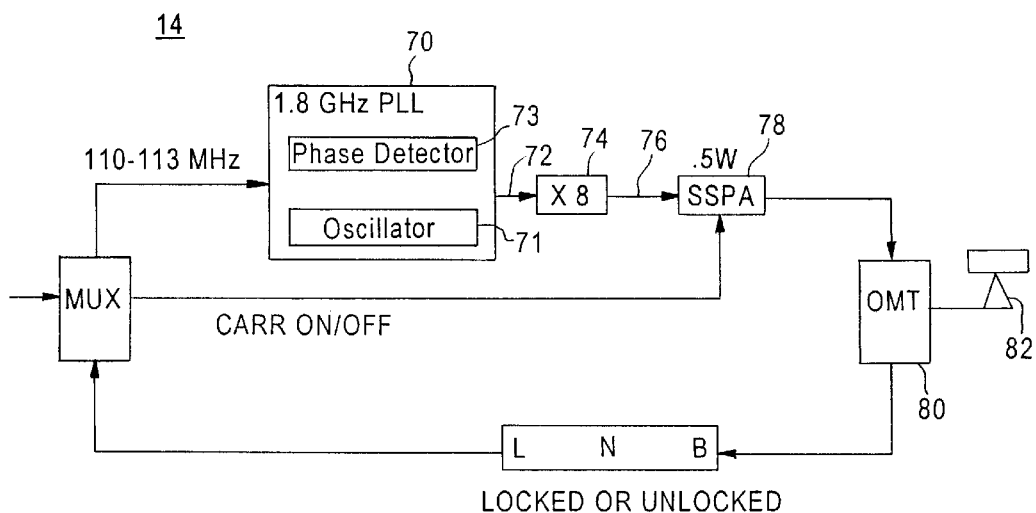
FIG. 3 is a schematic diagram of a first embodiment of an outdoor unit in accordance with the present invention.

A first preferred embodiment of the outdoor unit of the present invention is shown in FIG. 3. In the first preferred embodiment, the amplified and filtered 110 to 113 MHz signal 46' is coupled to a PLL 70. The PLL 70 multiplies the frequency and the FSK modulation of the signal 46' by a factor of 16 to produce a 1.76 to 1.81 GHz signal 72. This signal is coupled to a multiplier 74 which multiplies the signal 72 by a factor of 8 to produce a signal 76 with minimum shift key (MSK) modulation in a 14 to 14.5 GHz frequency band. This signal 76 is then amplified by a solid state power amplifier 78 and sent to an ortho mode transducer (OMT) 80. The OMT 80 launches the signal into a feed horn 82 which, in turn, sends the signal to the small aperture antenna 12 (see FIG. 1) for transmission to the satellite 24 (see FIG. 1).

A suitable PLL 70 shown in FIG. 3 is made of a Z-COM VCO 71 and an Analog Devices phase detector AD770173. The remainder of the components shown in FIG. 3 are commonly known in the art.

Figure 4:
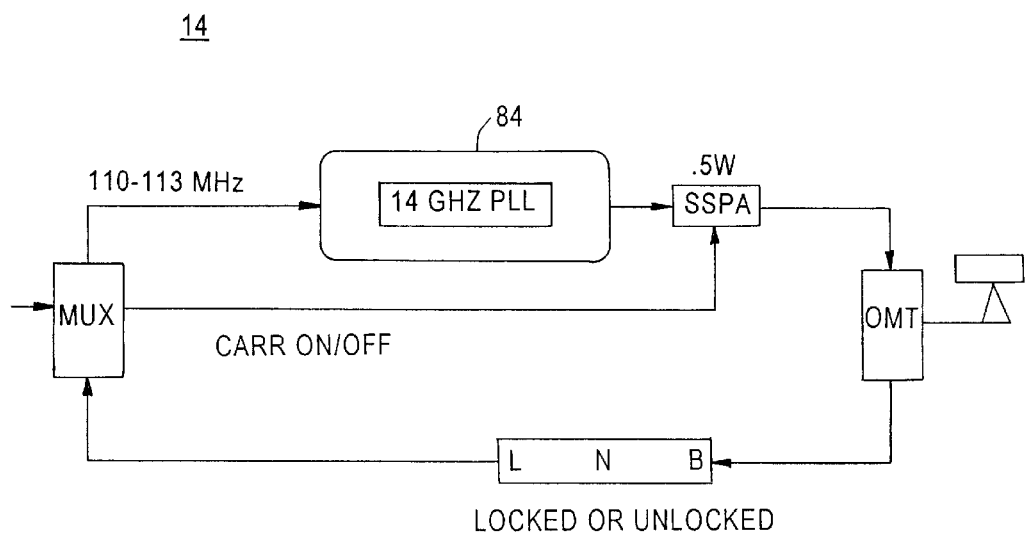
FIG. 4 is a schematic of a second embodiment of an outdoor unit in accordance with the present invention.

A second preferred embodiment of the outdoor unit 14 of the present invention is shown in FIG. 4. In this second preferred embodiment, the PLL 70 and multiplier 74 of FIG. 3 is replaced by a single Ku-band PLL 84. The components used to manufacture such a single Ku-band PLL 84 are currently in the design and testing stage. A single Ku-band PLL is desired because it would achieve the same affect as the configuration of FIG. 3 but with potentially lower cost.

The embodiments described above provide the following significant advantages: (1) no synthesizer is required, only a straightforward PLL or frequency multiplier is used; (2) power level control of the ODU's output can be reduced or eliminated because cable impairments do not affect the signal; and (3) control circuits in the ODU are reduced because the modulating data is impressed upon the IF signal directly and no separate multiplexing or other signal conveyance means is required.

Further simplification is achieved in the IDU by combining the frequency reference and the modulator into one DDS circuit.

It should be understood that a wide range of changes and modifications can be made to the preferred embodiment described above. It is therefore intended that the foregoing detailed description be regarded as illustrative rather than limiting and that it be understood that it is the following claims, including all equivalents, which are intended to define the scope of this invention.

What is claimed is:

1. An apparatus for performing digital fractional modulation comprising:

a first unit generating a fractionally modulated carrier signal having a frequency; and a second unit receiving said fractionally modulated carrier signal and multiplying the frequency of said fractionally modulated carrier signal upward to generate a high frequency signal for satellite transmission, wherein the second unit comprises:

a phase locked loop circuit comprising an oscillator and a phase detector, the phase locked loop circuit receiving said fractionally modulated carrier signal and multiplying said fractionally modulated carrier signal by a first predetermined factor to produce a higher frequency signal whereby the phase of said higher frequency signal tracks the phase of the fractionally modulated carrier signal;

a multiplier multiplying the higher frequency signal by a second predetermined factor to produce a minimum shift key (MSK) modulated signal;

a power amplifier amplifier the MSK modulated signal; and a transducer having a transmitter component, said transmitter component receiving the amplified signal and sending said amplified signal to a feed horn for ultimate transmission to the satellite.

2. The apparatus of claim 1 wherein the operating frequency of said fractionally modulated carrier signal is 5 to 8 MHZ.

3. The apparatus of claim 1 wherein the operating frequency of said fractionally modulated carrier signal is 110 to 113 MHZ.

4. A ground terminal for processing satellite communications comprising:

a first unit generating a fractionally modulated carrier signal;

a second unit receiving said fractionally modulated carrier signal and processing the fractionally modulated carrier signal to generate a minimum shift key (MSK) modulated satellite frequency signal; and an antenna transmitting said MSK modulated satellite frequency signal to a satellite, wherein the signal chain of the second unit comprises:

a phase locked loop circuit comprising an oscillator and a phase detector, the phase locked loop circuit receiving said fractionally modulated carrier signal and multiplying said fractionally modulated carrier signal by a first predetermined factor to produce a higher frequency signal whereby the phase of said higher frequency signal tracks the phase of the fractionally modulated carrier signal;

a multiplier multiplying the higher frequency signal by a second predetermined factor to produce said minimum shift key (MSK) modulated signal;

a power amplifier amplifying the MSK modulated signal; and a transducer having a transmitter component, said transmitter component receiving the amplified signal and sending said amplified signal to a feed horn for ultimate transmission to the satellite.

5. The ground terminal of claim 4 wherein the operating frequency of said fractionally modulated carrier signal is 5 to 8 MHZ.

6. The ground terminal of claim 4 wherein the operating frequency of the fractionally modulated carrier signal is 110 to 113 MHZ.

7. For user with an indoor unit for generating a fractionally modulated carrier signal having a frequency, an outdoor unit for multiplying the frequency of said fractionally modulated carrier signal upward to generate a high frequency signal for satellite transmission, the signal chain of the outdoor unit comprising:

a phase locked loop circuit for multiplying said fractionally modulated carrier signal by a first predetermined factor to produce a higher frequency signal whereby the phase of said higher frequency signal tracks the phase of the fractionally modulated carrier signal, the phase locked loop circuit including an oscillator and a phase detector;

a multiplier multiplying the higher frequency signal by a second predetermined factor to produce a minimum shift key (MSK) modulated signal;

a power amplifier amplifying the MSK modulated signal; and a transducer having a transmitter component, said transmitter component receiving the amplified signal and sending said signal to a feed horn for ultimate transmission to a satellite.

8. The apparatus of claim 7 wherein the operating frequency of said fractionally modulated carrier signal is 110 to 113 MHZ.

* * * * *